(12) United States Patent
Lin et al.

(10) Patent No.: US 9,161,471 B2
(45) Date of Patent: Oct. 13, 2015

(54) LED DISPLAY SCREEN CASE

(75) Inventors: Mingfeng Lin, Guangdong (CN); Wei Wang, Guangdong (CN); Chunwang Zhang, Guangdong (CN); Jiao Shen, Guangdong (CN)

(73) Assignee: UNILUMIN GROUP CO., LTD., Shenzhen (CN)

( * ) Notice: Subject to any disclaimer, the term of this patent is extended or adjusted under 35 U.S.C. 154(b) by 210 days.

(21) Appl. No.: 14/113,219

(22) PCT Filed: May 13, 2011

(86) PCT No.: PCT/CN2011/074028
§ 371 (c)(1),
(2), (4) Date: Oct. 22, 2013

(87) PCT Pub. No.: WO2012/142779
PCT Pub. Date: Oct. 26, 2012

(65) Prior Publication Data
US 2014/0043773 A1 Feb. 13, 2014

(30) Foreign Application Priority Data

Apr. 22, 2011 (CN) .................. 2011 2 0122442 U

(51) Int. Cl.
*H05K 1/11* (2006.01)
*H05K 7/10* (2006.01)
*G09F 9/33* (2006.01)

(52) U.S. Cl.
CPC ... *H05K 7/10* (2013.01); *G09F 9/33* (2013.01)

(58) Field of Classification Search
USPC ............. 361/679.01, 679.02, 679.21, 679.29, 361/679.61, 728–730, 792, 796, 736, 807, 361/809, 810
See application file for complete search history.

(56) References Cited

U.S. PATENT DOCUMENTS

| 4,558,914 | A  | * | 12/1985 | Prager et al. .................. 439/259 |
| 5,825,618 | A  | * | 10/1998 | Schnoor et al. ............. 361/679.6 |
| 6,571,115 | B2 | * | 5/2003  | Axelgaard et al. ............ 600/388 |
| 6,650,549 | B1 | * | 11/2003 | Chiao ............................ 361/785 |
| 7,748,992 | B1 | * | 7/2010  | Wooley et al. .................. 439/74 |

* cited by examiner

*Primary Examiner* — Hung S Bui

(57) ABSTRACT

An LED display screen case includes a module, a HUB plate, a case frame, a power supply and a receiving card. One side of the HUB plate is connected with the module by a plug A and an interface A in a plugging mode. The other side of the HUB plate is connected with the receiving card by a plug B and an interface B in the plugging mode. A through hole is formed at a position corresponding to the plug B on the case frame. The plug B passes through the through hole. The receiving card and the HUB plate are connected by the plug B and the interface B in the plugging mode and fixed to the two sides of the case frame. This kind of connection type reduces the space inside the case for accommodating devices, and also ensures the good radiating effect of the case.

20 Claims, 6 Drawing Sheets

LED DISPLAY SCREEN CASE

TECHNICAL FIELD

The present invention relates to the LED display field, and more especially, to an LED display screen case.

DESCRIPTION OF RELATED ART

LED displays are generally made into a large screen used as outdoor billboards and other development directions enable LED displays to stand on the ground; namely various vertical LED display boards, whose appearance can be of any shape, similar to small waiting signs such as bus stop boards. By virtue of its powerful functions, the LED display has been gradually applied in places such as commercial pedestrian streets, parks, and scenic spots.

HUB boards, which are actually the HUB adapter board of an LED display (also called interface board), are circuit boards with a HUB module.

A wall base is a protective plate around and parallel to the pin headers, wherein the shape enclosed by the protective plate matches the outer shape of the female header, and the female header after being inserted will be enclosed by the protective plate.

Currently, all the outdoor LED displays are made of a number of LED display screen cases connected together. However, common screen cases are relatively thick and heavy and have large size, for the interior of the screen cases has to provide space for the connection of a fan, a power supply, a receiving card, a HUB board and circuits. As shown in FIG. 1, a HUB board 2 can be fixed onto receiving card 5 securely by being inserted into wall base B8 of receiving card 5 via female header B10 on the board, and connect receiving card 5 with a HUB board 2, then connect an end of the oxhorn-like flexible circuit board to the wall base C18 on the HUB board 2 while connecting the other end to the interface of module 1, thus completing the transmission of video signals and fixing the power supply into the screen case correspondingly to supply power for the module and the receiving card. The screen case has a bad heat dissipation effect in itself and must be fitted with a fan, which prolongs its service life but causes unwieldy moving or carrying of the screen case.

BRIEF SUMMARY OF THE INVENTION

The present invention aims to provide an LED display screen case of small size and compact structure which can be dismantled and assembled conveniently and applied easily with good heat dissipation effect.

To solve the technical problems above, the present invention provides an LED display screen case which comprises a module, a HUB board, a screen case frame, a power supply and a receiving card, wherein one face of the HUB board is plug/unplug-connected with the module via plug A and interface A.

The other face of the HUB board is plug/unplug-connected with the receiving card via plug B and interface B, and the location corresponding to plug B on the screen case frame is provided with a through-hole through which plug B passes, thus the receiving card and the HUB board can be fixed on both sides of the screen case frame via the pluggable connection of plug B and interface B.

As an improvement of the present invention, the plug/unplug connection of plug A and interface A is the plug/unplug connection of the pin header and the female header or that of the wall base and the female header.

As an improvement of the present invention, the plug/unplug connection of plug B and interface B is the plug/unplug connection of the female header and the wall base or that of the pin header and the female header.

As an improvement of the present invention, the power supply is set on the same side as the receiving card is and a power supply holder for fixing the power supply to the screen case frame is provided inside the LED display screen case.

As an improvement of the present invention, holes are provided on the power supply holder, screw holes are provided at the locations on the screen case frame corresponding to the holes, and screws are used to fix the power supply by being inserted through the holes and screw holes of the power supply holder.

As an improvement of the present invention, the power supply holder is set with an extending part oriented to the screen case frame wherein clasps are provided on the extending part. Additionally, a card slot is provided correspondingly on the screen case frame and the power supply holder fixes the power supply via connection of the clasps.

As an improvement of the present invention, the screen case frame is provided with slots for accommodating the receiving card and the power supply.

As an improvement of the present invention, a signal interface and a power supply interface are also provided on the receiving card, the wall base B as well as the signal interface and the power supply interface are fitted on different faces of the receiving card respectively.

As an improvement of the present invention, the HUB board is an "H"-shaped board which has four plugs A or interfaces A on its four feet, and the HUB board has holes through which the boss provided correspondingly on the screen case frame passes to fix the HUB board to the screen case frame.

As an improvement of the present invention, the module comprises a bottom case, a PCB connected securely with the bottom case and several magnets, wherein the bottom case has several receiving holes in which the magnets are provided fixedly and the face of the bottom case back to the PCB is in magnetic connection with the screen case frame.

As an improvement of the present invention, several locating posts vertical to the surface of the bottom case are set on the bottom case and several locating holes on the screen case frame, besides, the locating posts match the locating holes.

As an improvement of the present invention, the magnets are step-like magnets, the receiving holes in the bottom case are also step-like holes and the large ends of the step-like magnets and the step-like holes face the PCB board.

As an improvement of the present invention, the screen case frame consists of a non-ferrous framework and an iron plate in fixed connection, wherein the iron plate is located on the surface of the screen case frame directly facing the module.

As an improvement of the present invention, the LED display screen case is further fitted with a back cover which is located on the side of the screen case frame where the receiving card is installed, wherein holes are set on the back cover and screw holes on the screen case frame correspondingly, besides, the back cover is fixed to the screen case frame via screw.

The favourable effects of the present invention include: meeting visual requirements of current customers for ultrathin LED displays and the LED display screen case becomes the mainstream of the market; to achieve a completely ultrathin effect of the screen case, the screen case is mostly designed to have no fan via re-designing and re-installing the devices inside the screen case, after which the connection not only can minimize the holding space for devices inside the screen case, but also guarantee good heat dissipation effect of the screen case, thus achieving the purpose of ultrathin screen case appearance and good heat dissipation effect.

Brief description of the reference numbers: 1—module; 2—HUB board; 3—screen case frame; 4—power supply; 5—receiving card; 6—female header A; 7—pin header A; 8—wall base B; 9—through-hole; 10—female header B; 11—power supply holder; 12—screen case back cover; 13—slot; 14—bottom case; 15—magnet; 16—receiving hole; 17—locating post; 18—wall base C

DETAILED DESCRIPTION OF THE INVENTION

To describe the technical contents, structural features, and realization purposes and effects more clearly, the embodiments will be taken to detail the present invention in combination with the drawings.

Figure 1:
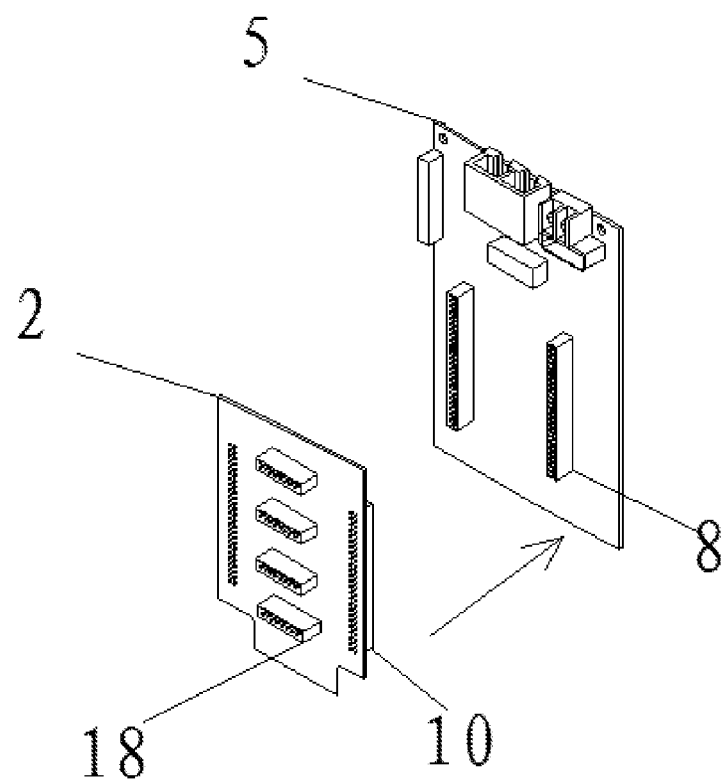
FIG. 1 is the schematic view of the connection of the receiving card with the HUB board inside a traditional LED screen case.
Figure 2:
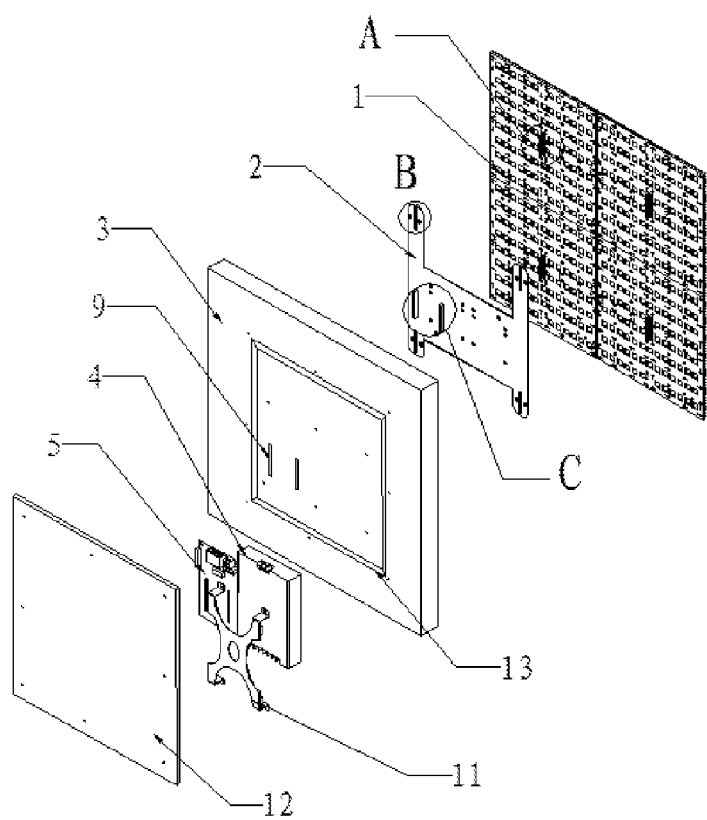
FIG. 2 is the schematic view of the LED display screen case of the present invention.
Figure 3:
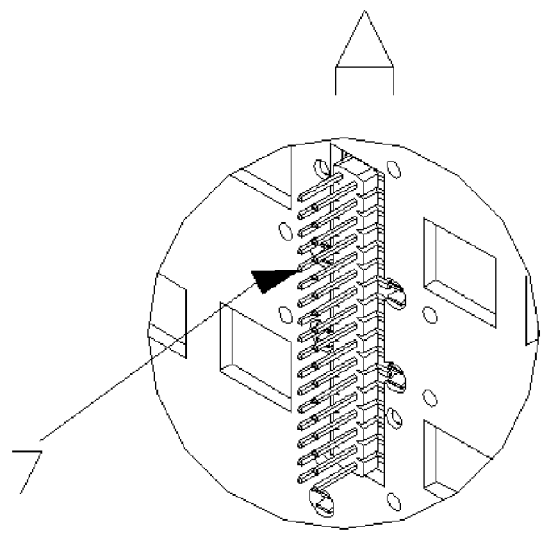
FIG. 3 is the partial enlarged view A of the module of the present invention.
Figure 4:
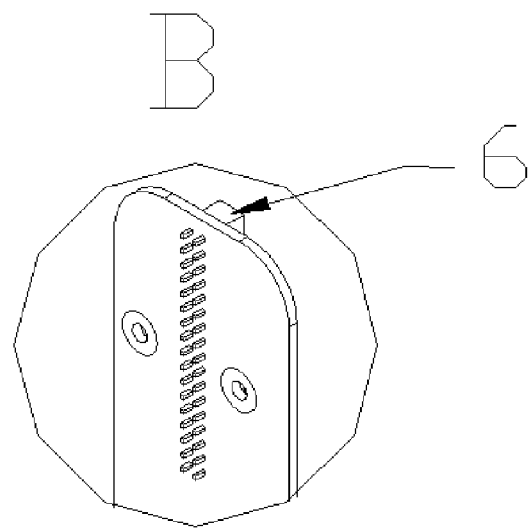
FIG. 4 is the partial enlarged view B of the HUB board of the present invention.
Figure 5:
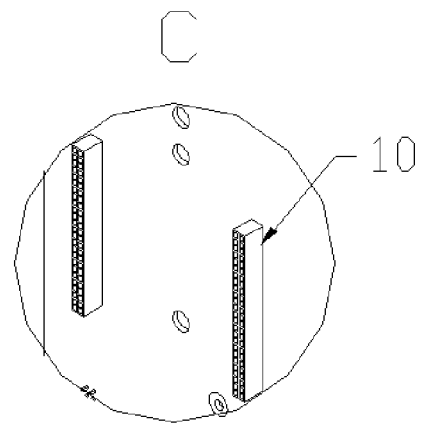
FIG. 5 is the partial enlarged view C of the HUB board and the present invention.

As shown in FIGS. 2 and 3, the present invention provides an LED display screen case, comprising a module 1, a HUB board 2, a screen case frame 3, a power supply 4 and a receiving card 5, wherein one face of the HUB card 2 is plug/unplug-connected with the module 1 via plug A and interface A.

The other face of the HUB board 2 is plug/unplug-connected with the receiving card 5 via plug B and interface B, and the location corresponding to plug B on the screen case frame 3 is fitted with a through-hole 9 through which plug B passes, and the receiving card 5 and the HUB board 2 can be fixed on both sides of the screen case frame 3 via the plug/unplug-connection of plug B and interface B.

The present invention subtly utilizes the fixed connection of plug A and interface A fitted on the HUB board 2 and the module 1, specifically, when setting plug A on the HUB board 2, provide interface A on the module 1, and when setting interface A on the HUB board 2, provide plug A on the module 1, thus leaving out the flexible circuit board connecting the HUB board 2 and the module 1 in traditional LED screen cases and reducing the space of the LED screen case effectively via unique design of the HUB board 2 and the module 1.

The other face of the HUB board 2 is plug/unplug-connected with the receiving card 5 via plug B and interface B, wherein plug B goes through the through-hole 9, and after interface B is inserted, the HUB board 2 and the receiving card 5 will be fixed on both sides of the screen case frame 3 respectively, besides, close adjoining of the HUB board 2 and the receiving card 5 to the screen case frame 3 contributes more to heat dissipation of the HUB board 2 and the receiving card 5 and thickness reduction of the LED screen case.

In another embodiment of the present invention, the plug/unplug connection of plug A and interface A is the plug/unplug connection of the pin header and the female header or that of the wall base and the female header.

In the embodiment, plug/unplug connection of pin header A7 and female header A6 is adopted so as to fix the connection of the HUB board 2 and the module 1 securely with correct transmission.

In another embodiment of the present invention, the plug/unplug connection of plug B and interface B is the plug/unplug connection of the female header and the wall base or that of the pin header and the female header.

In the embodiment, plug/unplug connection of female header B10 and wall base B8 is adopted so as to fix the HUB board 2 and the receiving card 5 to the screen case frame with good heat dissipation effect.

The present invention is not intended to limit the wall base B8 and the female header B10 to setting on the corresponding receiving card 5 or the HUB board 2. They can be set according to specific shape or requirement of the HUB board 2 or the receiving card 5 in practical operation.

In another embodiment of the present invention, as shown in FIG. 2, the power supply 4 is provided on the same side as the receiving card 5 is, and the side of the screen case frame 3 oriented to the receiving card 5 is provided with a slot 13 for holding the receiving card 5 and the power supply 4, namely the receiving card 5 and the power supply 4 are set in the slot 13.

In another embodiment of the present invention, as shown in FIG. 2, the interior of the LED display screen case is further fitted with the power supply holder 11 which can be disconnected from the screen case frame, wherein the power supply holder 11 fixes the power supply 4 to the screen case frame 3.

The power supply 4 and the receiving card 5 are set on the same side of the screen case frame 3 and placed in the slot 13 of the screen case frame 3, thus further reducing the thickness of the screen case.

In another embodiment of the present invention, as shown in FIG. 2, the power supply 4 is provided on the same side as the receiving card 5 is, and the interior of the LED display screen case is further fitted with the power supply holder 11 which fixes the power supply 4 to the screen case frame 3.

The power supply holder 11 fixes the power supply 4 to the screen case frame 3, which contributes to the interior heat dissipation, and fans can be omitted for good heat dissipation effect, thus reducing the thickness greatly.

Wherein, the power supply holder 11 fixes the power supply 4 specifically as below: holes are provided on the power supply holder 11, screw holes are provided on the locations on the screen case frame 3 corresponding to the holes, and the power supply 4 is fixed to the screen case frame by inserting screws through the holes of the power supply holder 11 and the screw holes on the screen case frame.

Threaded connection is a widely used detachable connection featuring simple structure, convenient disassembly and assembly, low cost, reliable working and other advantages, which can fix the power supply securely to the screen case frame.

Wherein, the power supply holder 11 can fix the power supply 4 in the following way as well: the power supply holder 11 is set with an extending part oriented to the screen case frame wherein clasps are provided on the extending part, besides, a card slot is fitted correspondingly on the screen case frame and the power supply holder 11 fixes the power supply 4 via connection of the clasps.

Connection of clasp and slot which has simple structure and works reliably can facilitate the disassembly and assembly of the power supply and the screen case frame effectively.

Fixing can also depend on magnet, adhesion and other equivalent alternative methods.

Figure 6:
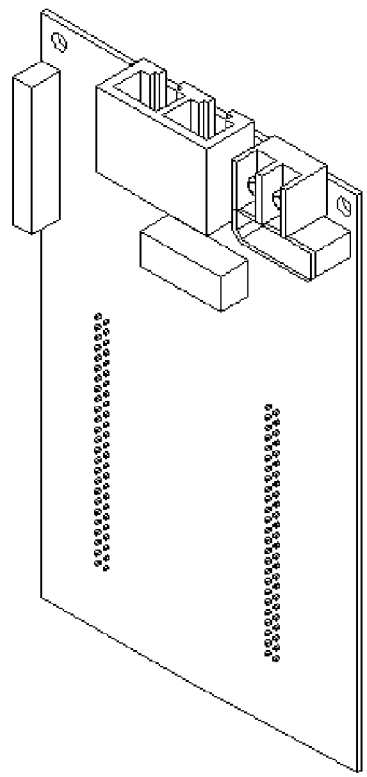
FIG. 6 is the schematic view of the receiving card of the present invention.

In another embodiment of the present invention, as shown in FIG. 6, the receiving card 5 is further fitted with a signal interface and a power supply interface, the wall base B8 as well as the signal interface and the power supply interface are fitted on different faces of the receiving card 5 respectively.

The wall base B8 of the receiving card designed by the present invention as well as other plugs or interfaces are welded on different faces, which is to facilitate the connection of the receiving card 5 and the HUB board 2, save space and cause no obstruction to the wiring connection on other interfaces in installation and assembly.

In another embodiment of the present utility model, the HUB board 2 is an "H"-shaped board which has four plugs A or interfaces A on its four feet, and the HUB board has holes through which the boss provided correspondingly on the screen case frame passes to fix the HUB board to the screen case frame.

Due to fixing the HUB board to the screen case frame via the boss's passing through the holes, plug B and interface B of the HUB board and the receiving card affix the HUB board with the receiving card, which facilitates heat dissipation effectively, thus playing an important role in manufacturing advanced LED displays.

Figure 7:
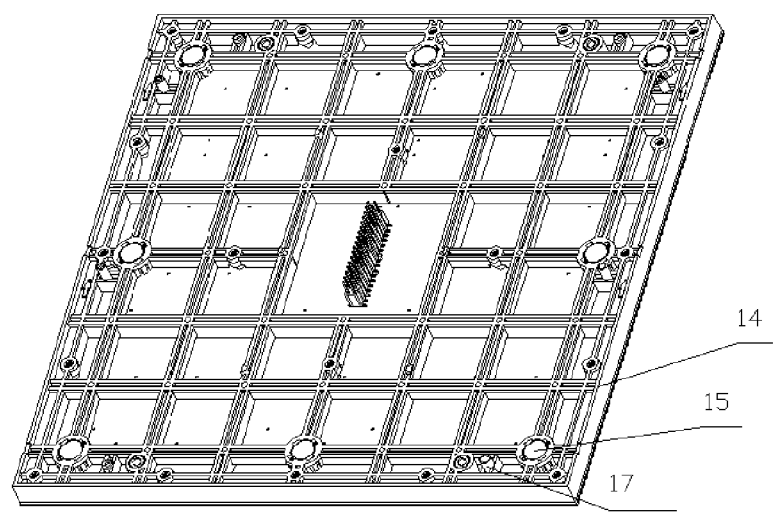
FIG. 7 is the schematic view of the module structure of the present invention.

In another embodiment of the present invention, as shown in FIG. 7, the module comprises a bottom case 14 and a PCB connected securely with the bottom case 14, wherein the module I further comprises several magnets 15, the bottom case 14 has several receiving holes 16, the magnets 15 are fitted fixedly in the receiving holes 16 and the face of the bottom case 14 back on to the PCB board is in magnetic connection with the screen case frame 3.

In the present invention, several receiving holes 16 are subtly fitted on the four sides of the bottom case 14 of the module 1, and as shown in FIG. 7, eight receiving holes 16 are provided on the bottom case 14 of the module 1, and the magnets 15 are set and fixed in the receiving holes 16, then the PCB board is fixed on the upper surface of the bottom case 14, while in fixing installation of the module 1 and the screen case frame 3, align the lower surface of the bottom case 14 with the screen case frame 3, thus completing the fixation of the module 1 via attraction force of the magnets 15 to the screen case frame 3, besides, if the module 1 is required to be dismantled from the screen case frame 3, pull the module 1 and the screen case frame 3 apart forcibly.

Due to the fixation of the magnets 15 to the screen case frame 3 through magnetic attraction force, no screw is required, thus saving the installation time, and for the disassembly of the module 1, pull the module 1 and the screen case frame 3 apart, which is convenient, meanwhile, because of great suction of the magnets 15, the module 1 as well as the HUB board 2 driven by the module 1 are attached closely on the screen case frame 3, further facilitating heat dissipation.

In the present invention, the periphery of the lower surface of the bottom case 14 can be set with several notches which can hold the top of a straight screwdriver, because notches are left on the connection surface of the module 1 and the screen case frame 3 after adhesion of the lower face of the bottom case 14 to the screen case frame 3 as well as the assembly of the module 1 and the screen case frame 3, besides, when dismantling the module 1, a straight screwdriver can be put into the notches to turn the module 1 up, thus the module 1 can be dismantled from the screen case frame 3.

In another embodiment of the present invention, as shown in FIG. 7, several locating posts 17 vertical to the surface of the bottom case 14 are set on the bottom case 14 and several locating holes on the screen case frame, besides, the locating posts 17 fit into the locating holes.

In installation, align the locating posts 17 with the corresponding locating holes, which can facilitate the module 1 to be installed correctly on the predetermined location without subsequent adjustment.

Figure 8:
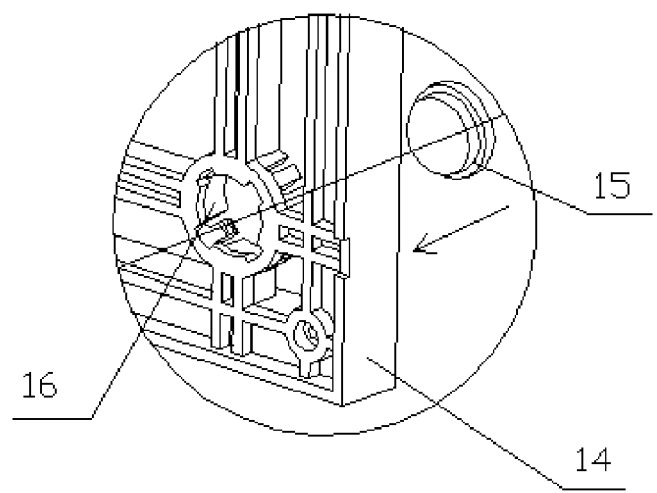
FIG. 8 is the schematic view of the installation of the magnets and the bottom case of the embodiment of the present invention.
Figure 9:
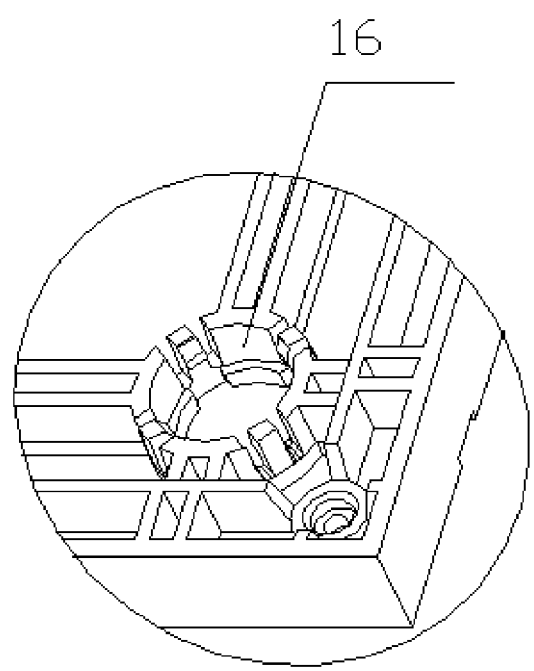
FIG. 9 is the partial enlarged view of the bottom case of the present invention.

In another embodiment of the present invention, as shown in FIG. 7 and FIG. 8, the magnets 15 are step-like magnets, the receiving holes 16 on the bottom case 14 are also step-like holes and the large ends of the step-like magnets and the step-like holes face the PCB board.

The receiving holes 16 are step-like through-holes, wherein each through-hole has round section and the inner diameter of the lower surface of each through-hole is smaller than that of the upper surface, thus forming a step at the bottom of the receiving holes 16, and several clamping posts are provided on the sidewall around the receiving holes 16, besides, each step-like magnet consists of two cylinders with different radiuses, wherein the axes of the two cylinders are on the same straight line and the junction surface of the two cylinders in step shape, and when installing the step-like magnets, orient the surface with smaller radius of the step-like magnets to the upper surface of the bottom case 14 directly, then put the step-like magnets into the receiving holes 16 forcibly, wherein the step parts of the step-like magnets are limited and fixed by steps, the large ends of the step-like magnets are locked by clamping posts, thus the step-like magnets can be installed fixedly in the receiving holes 16. To increase the magnetic force between the module 1 and the screen case frame 3, make the step height consistent with that of the part with smaller radius of the step-like magnets to enable the bottom surface with smaller radius of the step-like magnets to be flush with the lower surface of the bottom case 14, thus when installing the module 1, the magnets 15 can contact the screen case frame 3 directly to increase the magnetic force between them, thus achieving more secure fixation. The section of the step-like magnets can also be a square, a rectangle or an irregular polygon as long as the step-like shape is constructed by two cylinders, besides, the section of the receiving holes 16 can also be designed correspondingly into a different shape and the step-like magnets can be fixed in the receiving holes 16 via other fixing methods as well, for instance, use a thin board to confine the magnets 15 into the receiving holes 16, then fix the thin board and the bottom case 14 via screwed connection, or affix the magnets 15 into the receiving holes 16 directly.

As an improvement of the present invention, the screen case frame 3 consists of a non-ferrous framework and an iron plate in fixed connection, wherein the iron plate is located on the surface of the screen case frame 3 directly facing the module 1.

A sheet of iron is provided on the surface of the screen case frame 3 corresponding to the magnets 15. The sheet iron can be an iron frame or a sheet of iron of some specific points and used for fastening the module.

As an improvement of the present invention, as shown in FIG. 2, the LED display screen case is further fitted with a back cover 12 which is located on the side of the screen case frame 3 where the receiving card 5 is installed and fixed on the screen case frame 3.

After the internal devices and circuits are connected, use the back cover 12 to seal the screen case by means of screws, wherein holes are set on the back cover 12 and screw holes on the screen case frame 3 correspondingly, besides, and the back cover 12 is fixed to the screen case frame 3 via screws.

The above mentioned are just embodiments of the present invention and shall not constitute any limitation to the patent scope of the present invention. Any replacement of equivalent structures or equivalent procedures based on the contents of the Specification and the drawings of the present invention, or any application of the contents directly or indirectly into other relevant technical fields is covered by the patent protection scope of the present invention.

What is claimed is:

1. The display screen case includes an LED display screen case which comprises a module, a HUB board, a screen case frame, a power supply and a receiving card, wherein one face of the HUB board is plug/unplug-connected with the module via plug A and interface A; and the other face of the HUB board is plug/unplug-connected with the receiving card via plug B and interface B, and the location corresponding to plug B on the screen case frame is provided with a through-hole through which plug B passes, thus the receiving card and the HUB board can be fixed on both sides of the screen case frame via the pluggable connection of plug B and interface B.

2. The display screen case according to claim 1, the plug/unplug connection of plug A and interface A is the plug/unplug connection of the pin header and the female header or that of the wall base and the female header.

3. The display screen case according to claim 2, the LED display screen case is further fitted with a back cover which is located on the side of the screen case frame where the receiving card is installed, wherein holes are set on the back cover and screw holes on the screen case frame correspondingly, besides, the back cover is fixed to the screen case frame via screw.

4. The display screen case according to claim 1, the plug/unplug connection of plug B and interface B is the plug/unplug connection of the female header and the wall base or that of the pin header and the female header.

5. The display screen case according to claim 4, the LED display screen case is further fitted with a back cover which is located on the side of the screen case frame where the receiving card is installed, wherein holes are set on the back cover and screw holes on the screen case frame correspondingly, besides, the back cover is fixed to the screen case frame via screw.

6. The display screen case according to claim 1, the power supply is set on the same side as the receiving card is and a power supply holder for fixing the power supply to the screen case frame is provided inside the LED display screen case.

7. The display screen case according to claim 6, the holes are provided on the power supply holder, screw holes are provided at the locations on the screen case frame corresponding to the holes, and screws are used to fix the power supply by being inserted through the holes and screw holes of the power supply holder.

8. The display screen case according to claim 6, the power supply holder is set with an extending part oriented to the screen case frame wherein clasps are provided on the extending part additionally, a card slot is provided correspondingly on the screen case frame and the power supply holder fixes the power supply via connection of the clasps.

9. The display screen case according to claim 6, the LED display screen case is further fitted with a back cover which is located on the side of the screen case frame where the receiving card is installed, wherein holes are set on the back cover and screw holes on the screen case frame correspondingly, besides, the back cover is fixed to the screen case frame via screw.

10. The display screen case according to claim 1, the screen case frame is provided with slots for accommodating the receiving card and the power supply.

11. The display screen case according to claim 1, As an improvement of the present invention, a signal interface and a power supply interface are also provided on the receiving card, the wall base B as well as the signal interface and the power supply interface are fitted on different faces of the receiving card respectively.

12. The display screen case according to claim 11, the LED display screen case is further fitted with a back cover which is located on the side of the screen case frame where the receiving card is installed, wherein holes are set on the back cover and screw holes on the screen case frame correspondingly, besides, the back cover is fixed to the screen case frame via screw.

13. The display screen case according to claim 1, the HUB board is an "H"-shaped board which has four plugs A or interfaces A on its four feet, and the HUB board has holes through which the boss provided correspondingly on the screen case frame passes to fix the HUB board to the screen case frame.

14. The display screen case according to claim 13, the LED display screen case is further fitted with a back cover which is located on the side of the screen case frame where the receiving card is installed, wherein holes are set on the back cover and screw holes on the screen case frame correspondingly, besides, the back cover is fixed to the screen case frame via screw.

15. The display screen case according to claim 1, the module comprises a bottom case, a PCB connected securely with the bottom case and several magnets, wherein the bottom case has several receiving holes in which the magnets are provided fixedly and the face of the bottom case back to the PCB is in magnetic connection with the screen case frame.

16. The display screen case according to claim 15, several locating posts vertical to the surface of the bottom case are set on the bottom case and several locating holes on the screen case frame, besides, the locating posts match the locating holes.

17. The display screen case according to claim 16, the magnets are step-like magnets, the receiving holes in the bottom case are also step-like holes and the large ends of the step-like magnets and the step-like holes face the PCB board.

18. The display screen case according to claim 15, the screen case frame consists of a non-ferrous framework and an iron plate in fixed connection, wherein the iron plate is located on the surface of the screen case frame directly facing the module.

19. The display screen case according to claim 15, the LED display screen case is further fitted with a back cover which is located on the side of the screen case frame where the receiving card is installed, wherein holes are set on the back cover and screw holes on the screen case frame correspondingly, besides, the back cover is fixed to the screen case frame via screw.

20. The display screen case according to claim 1, the LED display screen case is further fitted with a back cover which is located on the side of the screen case frame where the receiving card is installed, wherein holes are set on the back cover and screw holes on the screen case frame correspondingly, besides, the back cover is fixed to the screen case frame via screw.

<p style="text-align:center">* * * * *</p>